United States Patent
Chu et al.

(10) Patent No.: US 10,984,882 B2
(45) Date of Patent: *Apr. 20, 2021

(54) RUN-TIME MEMORY DEVICE FAILURE DETECTION ENHANCEMENT

(71) Applicant: Western Digital Technologies, Inc., San Jose, CA (US)

(72) Inventors: Sanghoon Chu, San Jose, CA (US); Scott Jinn, Diamond Bar, CA (US); Yuriy Pavlenko, Lake Forest, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/586,861

(22) Filed: Sep. 27, 2019

(65) Prior Publication Data

US 2020/0027520 A1 Jan. 23, 2020

Related U.S. Application Data

(63) Continuation of application No. 15/600,673, filed on May 19, 2017, now Pat. No. 10,453,548.

(51) Int. Cl.
*G11C 29/44* (2006.01)
*G06F 11/07* (2006.01)
(Continued)

(52) U.S. Cl.
CPC .......... *G11C 29/44* (2013.01); *G06F 11/0727* (2013.01); *G06F 11/0757* (2013.01); *G06F 11/0772* (2013.01); *G06F 11/1402* (2013.01); *G06F 11/1438* (2013.01); *G06F 11/3034* (2013.01); *G06F 11/3055* (2013.01);
(Continued)

(58) Field of Classification Search
CPC . G11C 29/44; G11C 2229/72; G06F 11/0757; G06F 11/0727; G06F 2201/805; G06F 11/1402; G06F 11/0772
See application file for complete search history.

(56) References Cited

U.S. PATENT DOCUMENTS 6,954,932 B2 * 10/2005 Nakamura ................ G06F 9/54
709/217
7,543,048 B2 6/2009 Rothman
(Continued)

*Primary Examiner* — Guy J Lamarre
(74) *Attorney, Agent, or Firm* — Morgan, Lewis & Bockius LLP

(57) ABSTRACT

The subject technology provides implementations, which may be included as part of firmware of the flash memory device, that will not solely rely on a flash controller interpreted status but includes additional checks to the returned flash status byte. Each flash read, write, and erase command requires a status read command to determine the state of operation. Depending on the particular command issued, each bit of the returned status has a different meaning. The flash memory device firmware can check whether an illogical or inconsistent status is present. For example, if an overall pass/fail bit indicates a "pass" but a plane pass/fail bit indicates a "fail" then there could be an erroneous detection. Also, for every operation, the firmware can read status twice when the flash memory is ready. If the second status byte fails to match the first status byte then a die may be flagged as failing.

20 Claims, 4 Drawing Sheets

(51) Int. Cl.
   *G06F 11/14* (2006.01)
   *G11C 29/02* (2006.01)
   *G11C 29/38* (2006.01)
   *G11C 29/50* (2006.01)
   *G06F 11/30* (2006.01)

(52) U.S. Cl.
   CPC ............ *G11C 29/023* (2013.01); *G11C 29/38* (2013.01); *G11C 29/50012* (2013.01); *G06F 2201/805* (2013.01); *G11C 2229/72* (2013.01)

(56) References Cited

U.S. PATENT DOCUMENTS

| | | | |
|---|---|---|---|
| 9,921,763 B1 | 3/2018 | Zitlaw | |
| 10,453,548 B2* | 10/2019 | Chu | G06F 11/0727 |
| 2006/0101304 A1* | 5/2006 | Miura | G06F 11/1076 |
| | | | 714/6.32 |
| 2009/0172213 A1 | 7/2009 | Jayachandran | |
| 2012/0131253 A1* | 5/2012 | McKnight | G06F 13/385 |
| | | | 710/308 |
| 2017/0109224 A1 | 4/2017 | Scouller | |
| 2017/0125127 A1* | 5/2017 | Kim | G06F 11/1048 |
| 2017/0192914 A1 | 7/2017 | Riedy | |

* cited by examiner

RUN-TIME MEMORY DEVICE FAILURE DETECTION ENHANCEMENT

CROSS-REFERENCE TO RELATED APPLICATION

This application is a continuation of application Ser. No. 15/600,673, filed on May 19, 2017, now U.S. Pat. No. 10,453,548, the entirety of which is incorporated herein by reference for all purposes.

BACKGROUND

The subject application relates generally to memory devices. More specifically, the subject application relates to detection of die failure in flash memory devices.

Flash memory devices (for example, solid state drives (SSDs)) may detect errors or failures of flash memory die that occur when performing a read, write, or erase operation.

SUMMARY

According to aspects of the subject technology, a method for detecting flash memory device status includes detecting a program operation for a flash memory device. The method determines that a time period that satisfies a program threshold time has elapsed. The method sends, after the time period that satisfies the program threshold time has elapsed, a first check status command. The method receives a first signal indicating a first status. The method determines the first signal indicates a ready status. The method sends a second check status command after the indicated ready status from the first signal. Further, the method receives a second signal indicating a second status. The method determines whether the first signal unsuccessfully matches the second signal. The method provides, in response to determining that the first signal unsuccessfully matches the second signal, an indication of a failure of the flash memory device.

According to other aspects of the subject technology, a flash storage system is provided. The flash storage system includes means for detecting a program operation for a flash memory device. The flash storage system includes means for determining that a time period that satisfies a program threshold time has elapsed. The flash storage system includes means for sending, after the time period that satisfies the program threshold time has elapsed, a first check status command. The flash storage system includes means for receiving a first signal indicating a first status. The flash storage system includes means for determining whether the first signal indicates a ready status. The flash storage system includes means for sending a second check status command after the indicated ready status from the first signal. The flash storage system includes means for receiving a second signal indicating a second status. The flash storage system includes means for determining whether the first signal unsuccessfully matches the second signal. The flash storage system includes means for providing, in response to determining that the first signal unsuccessfully matches the second signal, an indication of a failure of the flash memory device.

According to other aspects of the subject technology, a flash storage system is provided. The flash storage system includes a plurality of flash memory devices, each of the plurality of flash memory devices including at least one flash memory die. The flash storage system includes a controller. The controller is configured to detect a program operation for a flash memory device; determine that a time period that satisfies a program threshold time has elapsed; send, after the time period that satisfies the program threshold time has elapsed, a first check status command; receive a first signal indicating a first status; determine whether the first signal indicates a ready status; send a second check status command after the indicated ready status from the first signal; receive a second signal indicating a second status; determine whether the first signal unsuccessfully matches the second signal; and provide, in response to determining that the first signal unsuccessfully matches the second signal, an indication of a failure of the flash memory device.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

Figure 1:
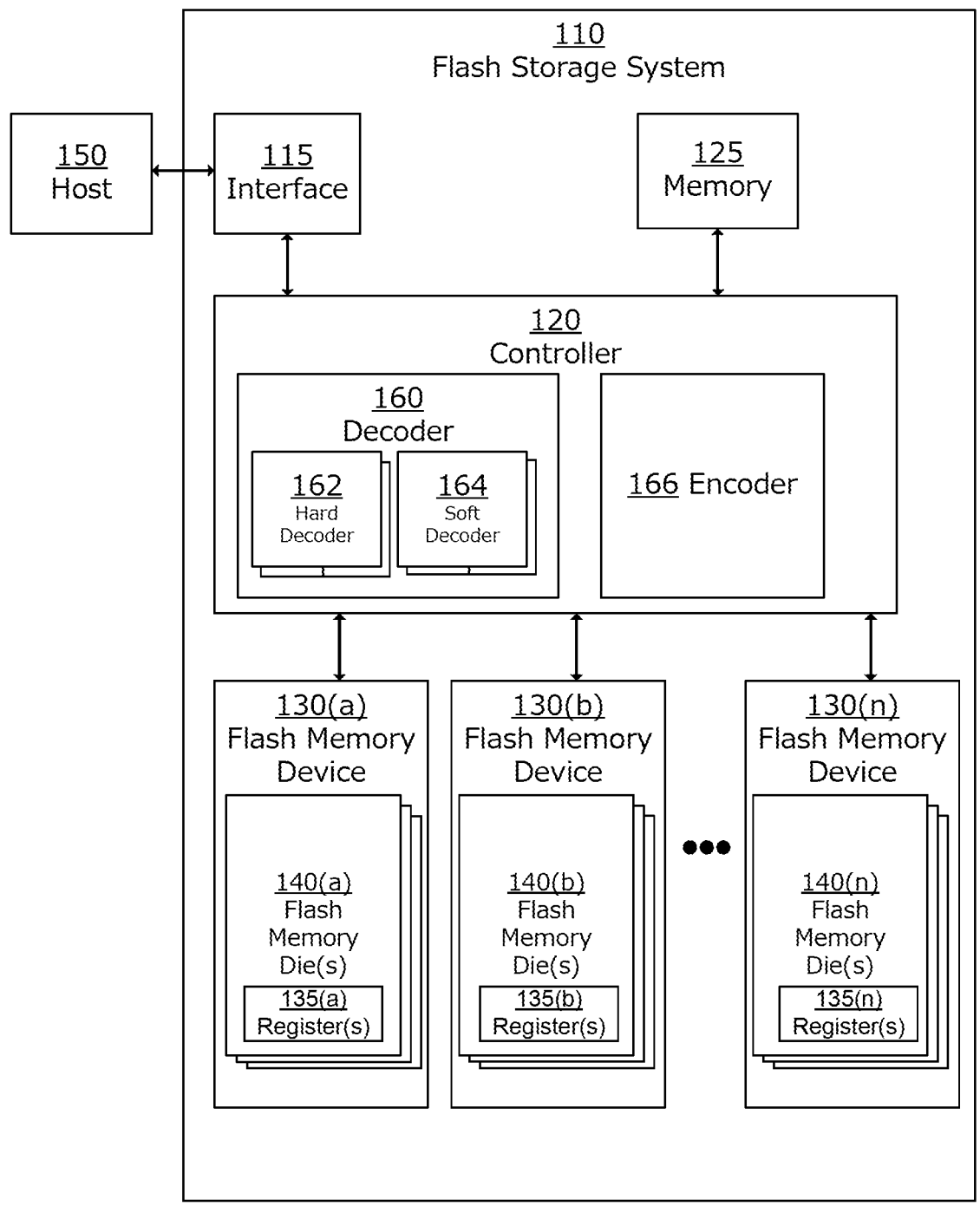
FIG. 1 is a block diagram illustrating components of a flash storage system according to aspects of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

One way for a flash memory controller to detect die failure (e.g., an unresponsive die) is to check a transition of a data strobe signal (DQS) signal going in a read direction. If the transition of the DQS signal is not detected within a configurable time window, a die failure status is returned. However, in a flash read direction, the DQS signal is not driven by the controller and if the die is also unresponsive, the DQS signal will be floating (e.g., in an undetermined state). This could result in an inaccurate detection of die failure as the controller may falsely sense the transition of DQS signal while the signal may instead be slowly discharging. Some controllers can enable a DQS bias resistor so that the signal will not be floating, which comes with the cost of additional power consumption. However, since die failure may not occur during the lifetime of a flash memory device, enabling the bias resistor will consume power even when the flash memory device is idle.

The subject technology provides implementations, which may be included as part of firmware of a flash memory device, that will not solely rely on a flash controller interpreted status but includes additional checks to returned flash status information. A flash memory device may provide one or more status registers to store flash status information to indicate whether an operation (e.g., a read operation, a program operation, an erase operation, etc.) is in progress or has completed. A status register may also indicate whether a particular operation has been completed successfully or unsuccessfully (e.g., failed). In an example, a status byte includes eight bits (or any number of bits) where one or more of bits may be used to provide a specific status signal. To determine a status of a particular operation, a controller of a flash memory device may send a status read command to receive a status signal based on the information stored in the status register. For example, the controller may want to know if a program operation is completed or been suspended or failed, etc., and may do so by issuing a status read command.

In implementations provided by the subject technology, flash read, write, and erase commands (and other commands) issued by the controller may be followed with the controller sending a separate status command to determine the state (e.g., ready, busy, pass, fail, write protected, etc.) of a flash memory die executing the initial command. The controller can therefore check whether an illogical or inconsistent status is present. Depending on the particular command issued, each bit or subset of bits from the returned status may correspond to a different meaning. For example, if an overall pass/fail bit indicates a "pass" but a plane pass/fail bit indicates a "fail" then there could be an erroneous detection. Also, for every operation, the controller can read status twice when the flash memory is ready. If the second status byte fails to match the first status byte then a die may be flagged as failing.

FIG. 1 is a block diagram illustrating components of a flash storage system 110 according to aspects of the subject technology. As depicted in FIG. 1, the flash storage system 110 includes an interface 115, a controller 120, a memory 125, a decoder 160, an encoder 166, and flash memory devices 130. The interface 115 facilitates communication of data, commands, and/or control signals between the flash storage system 110 and a host 150. The controller 120 controls the operation of the flash storage system 110 to store and retrieve data in the flash memory devices 130 (e.g., illustrated as flash memory device 130(*a*), 130(*b*) to 130(*n*) to depict at least several devices) in accordance with commands received from the host 150 and an internal management processor 145. The controller 120 may include a single core processor or a multi-core processor which includes several separate computing cores for executing instructions. For example, the computing cores in the multi-core implementation can run respective instructions in parallel including portions of the firmware of the flash storage system 110. The memory 125, which may be a random access memory (RAM), provides temporary storage space for the controller 120 to process commands and transfer data between the host 150 and the flash memory devices 130. The decoder 160, which may include memory, registers, logic gates, one or more processors, and may be integrated with or separate from the controller 120, decodes data. The encoder 166, which may include memory, registers, logic gates, one or more processors, and may be integrated with or separate from the controller 120, encodes data to be written to the flash memory device 130. The operation of each of these components is described in more detail below.

The interface 115 provides physical and electrical connections between the host 150 and the flash storage system 110. The interface 115 is configured to facilitate communication of data, commands, and/or control signals between the host 150 and the flash storage system 110 via the physical and electrical connections. The connection and the communications with the interface 115 may be based on a standard interface such as Universal Serial Bus (USB), Small Computer System Interface (SCSI), Serial Advanced Technology Attachment (SATA), Mini-SATA (mSATA), PCIe, etc. Alternatively, the connection and/or communications may be based on a proprietary interface, although the subject technology is not limited to any particular type of interface.

The host 150 may be a computing device, such as a computer/server, a smartphone, or any other electronic device that reads data from and writes data to the flash storage system 110. The host 150 may have an operating system or other software that issues read and write commands to the flash storage system 110. The flash storage system 110 may be integrated with the host 150 or may be external to the host 150. The flash storage system 110 may be wirelessly connected to the host 150, or may be physically connected to the host 150.

The controller 120 may also include an internal management processor, which may run on one of the cores of the controller 120 in a multi-core implementation. The internal management processor may use the interface 115 to communicate with other components illustrated in FIG. 1, including the host 150, the memory 125, the controller 120, and the flash memory devices 130.

FIG. 1 shows multiple flash memory devices 130. The flash storage system 110 may include one or more flash memory devices 130 and is not limited to a particular number of flash memory devices 130. The flash memory devices 130 may each include one or more flash memory chips or dies 140. The flash memory devices 130 may be organized among multiple channels through which data is read from and written to the flash memory devices 130 by the controller 120, or coupled to a single channel. The flash memory devices 130 may be implemented using NAND flash memory. The flash memory devices 130 may each comprise one or more registers 135 for storing operating parameters of the respective flash memory devices 130. The operating parameters may include: read operation parameters such as read voltages; write operation parameters such as initial pulse value, incremental pulse value, and pulse width; and erase operation parameters such as initial pulse value, incremental pulse value, and pulse width.

The flash memory devices 130 may comprise multiple dies such as flash memory dies 140 (e.g., illustrated as flash memory dies 140(*a*), 140(*b*) to 140(*n*) to depict at least several dies). The flash memory devices 130 may have one or more flash memory dies 140, and the flash memory devices 130 may each have the same or different numbers of flash memory dies 140. Each of the flash memory dies 140 may be further divided into one or more planes, and each plane includes a number of blocks. The blocks of each plane may be referred to as data blocks, storage blocks, or flash memory blocks and are addressable by the controller 120 using a physical block address. Each block may include multiple data segments or pages addressable by the controller 120 using a physical page address or offset from a physical block address of the storage block containing the referenced page. The pages may store sectors or other host data units. In an example, the flash memory blocks represent the units of data that are erased within the flash memory devices 130 in a single erase operation. The pages represent the units of data that are read from or written to the flash memory devices 130 in a read or write operation. Although the flash memory devices 130 are described in terms of dies, planes, blocks and pages, other terminology may be used to refer to these data units within a flash storage device.

The subject technology is not limited to any particular capacity of flash memory. For example, each die may include 2 planes (or any other number of planes), and each plane may include 1024 storage blocks (or any other number of storage blocks). For example, the storage blocks may each comprise 32, 64, 128, or 512 pages, or any other number of pages. Additionally, pages may each comprise 512 bytes, 2 KB, 4 KB, or 32 KB, for example. The sectors may each comprise, for example, 512 bytes, 4 KB, or other sizes. There may be one or more sectors per page.

In FIG. 1, the memory 125 represents a volatile memory coupled to and used by the controller 120 during operation of the flash storage system 110. The controller 120 may buffer commands and/or data in the memory 125. The controller 120 also may use the memory 125 to store address mapping tables or lookup tables used to convert logical addresses used by the host 150 into virtual and/or physical addresses corresponding to blocks and pages of the flash memory devices 130. Other types of tables, data, status indicators, etc. used to manage the flash memory devices 130 may also be stored in the memory 125 by the controller 120. For example, LLR (logarithmic likelihood ratio) tables may be stored in the memory 125. The memory 125 may be implemented using dynamic random access memory (DRAM), static random access memory (SRAM), or other types of volatile random access memory without departing from the scope of the subject technology. The controller 120 may periodically store the contents of the memory 125 into one or more designated flash memory blocks in the flash memory dies 140, such as before the flash storage system 110 is powered down.

The controller 120 manages the flow of data between the host 150 and the flash memory devices 130. The controller 120 is configured to receive commands and data from the host 150 via the interface 115. For example, the controller 120 may receive data and a write command from the host 150 to write the data in the flash memory devices 130. The controller 120 is further configured to send data to the host 150 via the interface 115. For example, the controller 120 may read data from the flash memory devices 130 and send the data to the host 150 in response to a read command. The controller 120 is further configured to manage data stored in the flash memory devices 130 and the memory 125 based on internal control algorithms or other types of commands that may be received from the host 150. For example, the controller 120 is configured to perform operations such as garbage collection (GC), error correction, and wear leveling. Those skilled in the art will be familiar with other operations performed by a controller in a flash storage device, which will not be described in detail herein.

The controller 120 may be implemented with a general purpose processor, multi-core processor, micro-controller, digital signal processor (DSP), a system-on-a-chip (SoC), an application specific integrated circuit (ASIC), a field programmable gate array (FPGA) or other programmable logic device, discrete gate or transistor logic device, discrete hardware components, or any combination thereof designed and configured to perform the operations and functions described herein. In the multi-core processor implementation, each of the several computing cores can run respective instructions in parallel including portions of the firmware of the flash storage system 110. The controller 120 may perform the operations and functions described herein by executing one or more sequences of instructions stored on a machine/computer readable medium. The machine/computer readable medium may be the flash memory devices 130, the memory 125, or other types of media from which the controller 120 can read instructions or code. For example, flash storage system 110 may include a read only memory (ROM), such as an EPROM or EEPROM, encoded with firmware/software comprising one or more sequences of instructions read and executed by the controller 120 during the operation of the flash storage system 110.

The decoder 160 may be implemented with a general purpose processor, micro-controller, digital signal processor (DSP), a system-on-a-chip (SoC), an application specific integrated circuit (ASIC), a field programmable gate array (FPGA) or other programmable logic device, discrete gate or transistor logic device, discrete hardware components, or any combination thereof designed and configured to perform the operations and functions described herein. The decoder 160 may be integrated with the controller 120, or may be separate. The decoder 160 may be configured to use LDPC. The decoder 160 may be configured to use additional or alternative decoding schemes. The decoder 160 includes one or more hard decoders 162 and one or more soft decoders 164. The hard decoders 162 may be decoders that are reserved for hard decoding. Hard decoding limits the read bit values to either a "1" or a "0." Soft decoding, on the other hand, uses a range of values pulled from an LLR table, for example, to provide reliability or confidence measures that the read values are correct. The LLR table allows the confidence values to be looked up based on the read outcomes. The soft decoders 164 may be decoders that are reserved for soft decoding. In certain implementations, the number of hard decoders 162 and the number of soft decoder 164 may be dynamically reserved from a pool of available decoders.

In an example, a read operation starts with a request for data, for example from the host 150 or the controller 120. The controller 120 sends a read command to the appropriate flash memory device 130 storing the requested data. The flash memory device 130 provides data, for example in a buffer, which the decoder 160 decodes for a hard decode operation. More specifically, the hard decoder 162 may decode the data for the hard decode operation. The decoder 160 returns an indication to the controller 120 after completing the hard decode operation. If the indication indicates successful decoding, the controller 120 returns the decoded data to the host 150 in response to the request for data.

In an example, the host 150 may want raw data written to the flash memory device 130. The controller 120 may receive the raw data from the host 150 and issue a program command to the appropriate flash memory device 130. The raw data, in an example, may be stored in a buffer. The encoder 166 encodes, using an appropriate encoding scheme, the raw data into encoded data, which is to be written to the flash memory device 130.

Different techniques may be used to detect die failure on the flash memory devices 130. In an example, the controller 120 could check for a transition of a DQS signal in a read direction within a time window. As mentioned before, using the DQS signal in this manner may have a disadvantage of an inaccurate detection of die failure. To detect a failure of a flash memory die and mitigate an inaccurate detection of die failure, the subject technology provides implementations using two check status commands that are sent in a successive manner.

Figure 2:
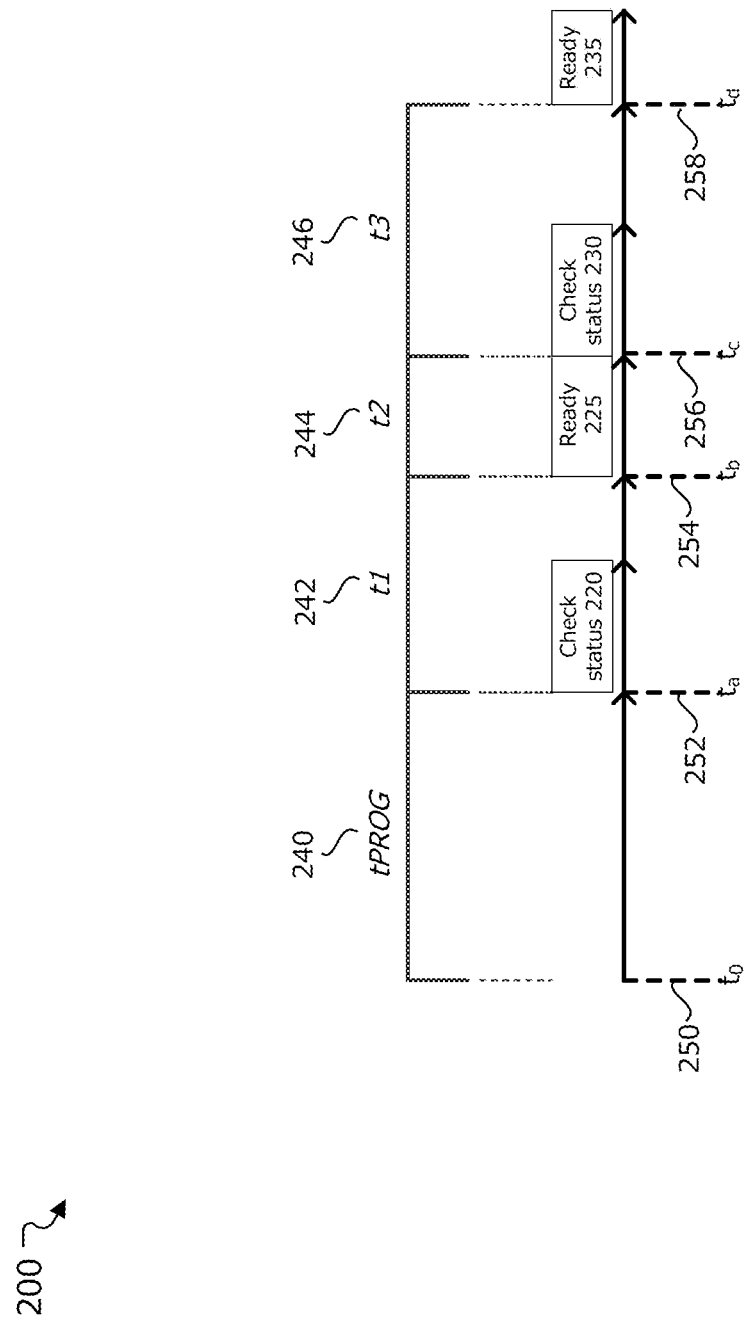
FIG. 2 illustrates an example timing diagram corresponding to sending check status commands for determining a status of a flash memory device according to aspects of the subject technology.

FIG. 2 illustrates an example timing diagram corresponding to sending check status commands for determining a status of a flash memory device. In the example of FIG. 2, a status of a flash memory die may be determined. It is appreciated, however, that a status of other portions of a flash memory device, including the storage blocks and pages, could be determined and still be within the scope of the example of FIG. 2.

At time $t_0$ 250, the controller 120 may detect that a program operation is being performed. In an example, this could be determined by tracking that a program command has been issued by the controller 120.

A time interval 240 ("tPROG") represents a period of time for programming data on the flash memory device 130, and in particular with respect to programming data on one of the flash memory dies 140. The time interval 240 may represent an expected time for completing a program operation. In another example, the time interval 240 represents an average time for completing a program operation, which could be determined based on metrics that are tracked by the flash storage system 110 or the controller 120. In particular, respective times for completing program operations could be tracked over a prior period of time in order to determine the average time. At time $t_a$ 252, a first check status command may be sent to determine the status of the flash memory die. A time interval 242 ("t1") may elapse before receiving an indication of the status of the flash memory die.

At time $t_b$ 254, a first ready status signal 225, which may include a first number of bits (e.g., 8 bits or 32 bits or any number of bits), is received. The first ready status signal 225 may include a pattern of bits. The pattern of bits, in an example, may be an alternating sequence of 0 and 1 bits (e.g., "01010101" or "10101010). A particular bit from the pattern may correspond to respective status information indicating the status of a flash memory die, or status of some other portion of the flash memory device 130. For example, a first bit from the pattern may indicate a ready status of a flash memory die, and a second bit may indicate another status such as an overall pass status of the flash memory die. The first ready status signal 225 may be stored in one of the registers 135.

A time interval 244 ("t2") may elapse before the controller 120 sends another command to check the status of the flash memory die. At time $t_c$ 256, a second check status command 230 may be sent after the time interval 244 has elapsed. The time interval 244 may correspond to a time that is substantially immediately after the first ready status signal 225 was received at time 254. A time interval 246 ("t3") may elapse before receiving an indication of the status of the flash memory die.

At time $t_d$ 258, a second ready status signal 235, which may include a second number of bits, is received. In an example, the second number of bits is the same as the number of bits of the ready status signal 225. The second ready status signal may be compared with the first ready status signal 225. When the first and second ready status signals match, then it is confirmed that the flash memory die is still in a good state. However, in instances where the first and second ready status signals differ or do not match, the controller 120 may flag the flash memory die as failed. A false positive can be therefore detected by comparing the two sets of status bits, respectively, from the first ready status signal 225 and the second ready status signal 235.

In some examples, each of the time intervals described above may be different time intervals. In other examples, each of the time intervals may be the same time interval. Further, some of the time intervals may be the same time interval while one or more other time intervals are different. Although FIG. 2 is not drawn to scale, the lengths of each line generally correspond to length of time. In an example, a time in which a program operation is completed may be longer than a time that a ready status signal is received after a check status command is sent.

Figure 3:
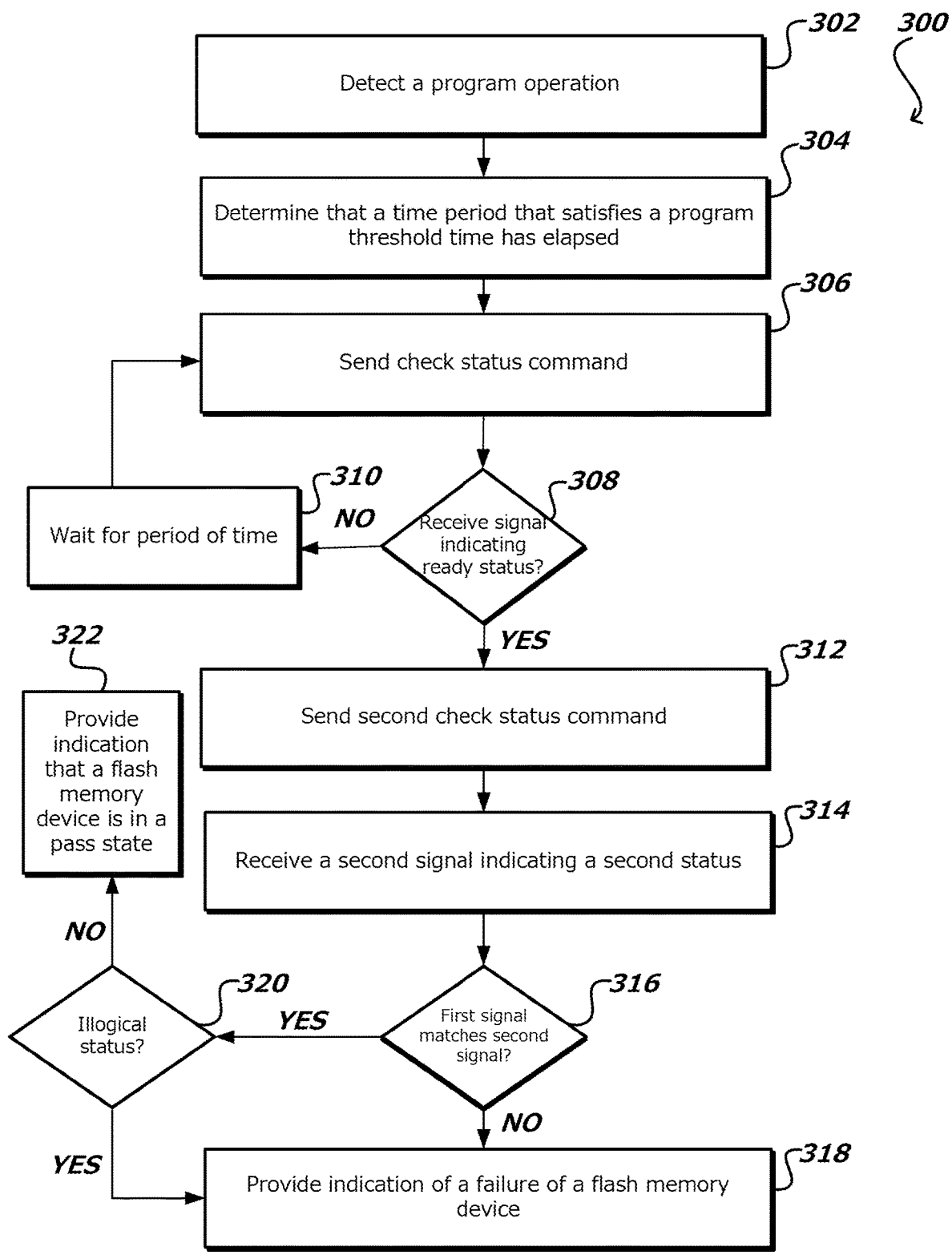
FIG. 3 shows a flowchart of a process for sending two check status commands to determine a failure of a flash memory die according to aspects of the subject technology.

The above described flash memory failure detection implementation of FIG. 2 is discussed further below in reference to FIG. 3. FIG. 3 shows a flowchart 300 of a process for sending two check status commands to determine a failure of a flash memory die. The host 150 sends data for storing to one of the flash memory devices 130. The controller 120 issues an initial program command to the flash memory device 130, which may be selected based on an address that is indicated as being free space. The process of FIG. 3 begins with detecting a program operation.

At 302, the controller 120 detects an instruction of a program operation for a flash memory device (or portion thereof, such as a flash memory die therein). At 304, the controller 120 determines that a time period that satisfies a program threshold time has elapsed. The program threshold time may correspond to a time for completing a program operation (e.g., tPROG as shown in FIG. 2) for writing or storing data on the flash memory die. At 306, the controller 120 sends, after the time period that satisfies the program threshold time has elapsed, a first check status command.

At 308, the controller 120 determines whether a signal has been received indicating a ready status. If a signal has not been received or a signal indicating a busy or not ready status is received, a period of time is waited at 310, and the controller 120 sends another check status command at 306. In the event that a first signal indicating a ready status is received, the controller 120 at 312 sends a second check status command.

The first signal may include a first plurality of bits, which are stored in a buffer (e.g., register(s)), and in which the bits form a predetermined pattern. For example, the pattern may be a repeating sequence of a high bit and then a low bit, or vice versa. As discussed before, a particular bit from the pattern may correspond to respective status information indicating the status of a flash memory die, or status of some other portion of the flash memory device 130. For example, a first bit from the pattern may indicate a ready status of a flash memory die, and a second bit may indicate another status such as an overall pass status of the flash memory die. Other patterns or sequence of bits are contemplated by the subject technology and the previous example should not be viewed as limiting. For example, the pattern may include a first repeating number of one (1) bits followed by a second number of repeating zero (0) bits and so on.

At 314, the controller 120 receives a second signal indicating a second status. The second signal may be stored in a buffer, and compared to the respective bits of the first signal previously stored in the buffer. At 316, the controller 120 determines whether the first signal matches the second signal. At 320, in response to determining that the first signal matches the second signal, the controller 120 determines whether an illogical status is detected. In an example, an illogical status can occur when the flash memory die is stuck in a particular mode (such as a read mode) and the status clocked out is not from a status register but instead from a page buffer. At 322, in response to determining that an illogical status was not detected, an indication of an overall pass of the flash memory device (e.g., the flash memory die) is provided. Alternatively, in response to determining that an illogical status was detected, the controller 120 provides an indication of a failure of the flash memory device (e.g., the flash memory die) at 318.

Alternatively, at 316 the controller 120 may determine that the first signal unsuccessfully matches the second signal by determining that the first plurality of bits is different than the second plurality of bits (e.g., the respective plurality of bits do not match with each other). At 318, the controller 120 provides, in response to determining that the first signal unsuccessfully matches the second signal, an indication of a failure of the flash memory device (e.g., the flash memory die).

Figure 4:
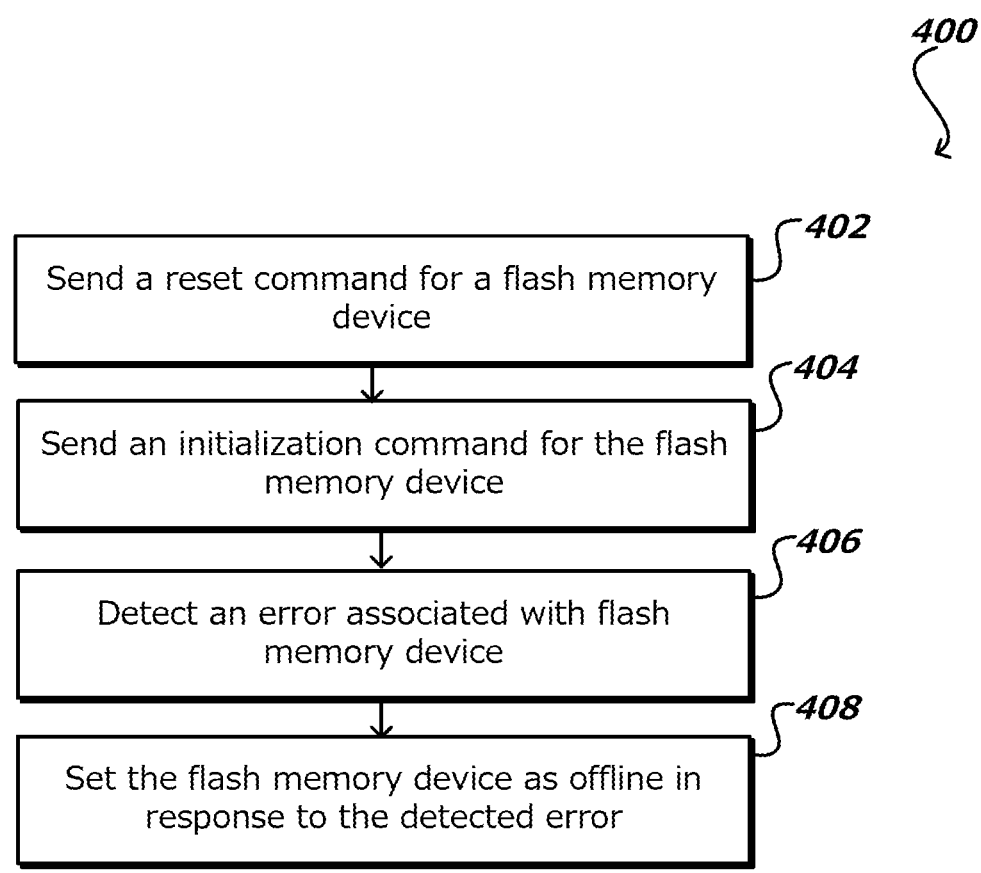
FIG. 4 shows a flowchart of an attempted recovery process of a flash memory device in response to an indication of failure of the flash memory device according to aspects of the subject technology.

FIG. 4 shows a flowchart 400 of an attempted recovery process of a flash memory device in response to an indication of failure of the flash memory device (e.g., as described by reference to FIG. 3). The process of FIG. 4 starts after an indication of a failure of the flash memory device is detected.

At 402, the flash storage system 110 sends, in response to the indication of the failure of the flash memory device, a reset command for the flash memory device. At 404, the flash storage system 110 sends an initialization command for the flash memory device which may attempt to reset the flash memory device back to factory settings or some predetermined state. At 406, the flash storage system 110 detects an error associated with the flash memory device in response to the initialization command. At 408, the flash storage system 110 sets the flash memory device as offline in response to the detected error.

In some implementations, instead of handling each NAND die error individually, the subject technology may provide proactive tracking of NAND die status. If a pattern of errors matches specific conditions (e.g., incorrect status, number of errors from different sources, program error pattern), then a die is declared "offline" and further access to this die is prohibited in at least:
  no further program or erase operations on the die;
  existing data may be eventually rebuilt using RAID (XOR) and moved somewhere else on the flash storage system 110.

Declaring a die as being offline prevents an "error storm" condition in case of a faulty die. In case of an error storm (e.g., when many flash operations result in an error status) the performance degradation is significant. For example, errors can result in multiple recovery steps including soft-LDPC decoding and RAID (XOR) recovery, which may increase latency and/or tie up resources. Preventing access to a faulty die therefore improves or mitigates degradation of system performance.

In cases where a die becomes bad (e.g., faulty electronics or faulty cell array), the following conditions may result:
  (1) die is not responding or responding with invalid status;
  (2) die is returning error status to all or most flash operations.

When the flash storage system 110 detects the first condition, the system attempts to reset faulty die using, for example, "Reset" and "Factory_Reset" commands. If the first condition still exists after resetting, the die is marked as offline and further access to this die is prohibited.

Detection of the second condition may require distributed logic as successful operations may be interleaved with errors. In some implementations, configurable thresholds are provided, for example:
  (a) a number of runtime bad block from all sources is greater than 20% (or some other threshold percentage) of total die capacity;
  (b) there are greater than 50 (or some other threshold number) program errors on a die during specified time frame or specific access pattern (depending on throughput).

Thus, individual handling of each error may be costly and directly affecting latency and throughput of the flash storage system 110. It is therefore better to stop handling each individual error and declare a die as offline, similar to the first condition, resulting in preventing future access to this die.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (for example, arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (for example, his) include the feminine and neuter gender (for example, her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A storage system, comprising:
   a plurality of memory devices; and
   a controller configured to cause:
      responsive to a time interval having elapsed, providing a first check status command, wherein the time interval is associated with an operation for a memory device of the plurality of memory devices;
      receiving a first signal;
      determining whether the first signal indicates a status of the memory device;
      providing a second check status command after the first check status command;
      receiving a second signal;
      determining whether the second signal is different from the first signal; and
      responsive to the second signal being different from the first signal, providing an indication of a failure of the memory device.

2. The storage system of claim 1, wherein the controller is further configured to cause:
   responsive to the second signal matching the first signal, determining whether an illogical status is detected;
   responsive to determining that the illogical status is detected, providing the indication of the failure of the memory device; and
   responsive to determining that the illogical status is not detected, providing an indication of a success of the memory device.

3. The storage system of claim 1, wherein the time interval represents a time for completing the operation for writing data on the memory device.

4. The storage system of claim 1, wherein:
   the time interval represents an average time for completing the operation; and
   the operation is a program operation.

5. The storage system of claim 1, wherein the time interval represents an expected time for completing the operation.

6. The storage system of claim 1, wherein:
   the first signal comprises a first number of bits;
   the second signal comprises a second number of bits; and
   the first number is equal to the second number.

7. The storage system of claim 1, wherein:
   the first signal comprises a first plurality of bits; and
   one of the first plurality of bits indicates a ready status.

8. The storage system of claim 7, wherein:
   another bit of the first plurality of bits indicates another status of the memory device; and
   the another status is different from the ready status.

9. The storage system of claim 1, wherein the memory device is one or more memory dies.

10. The storage system of claim 1, wherein the operation is for one or more storage blocks of the memory device.

11. The storage system of claim 1, wherein the controller is further configured to cause:
    providing, in response to the indication of the failure of the memory device, a reset instruction for the memory device;
    providing an initialization instruction for the memory device;
    after providing the initialization instruction, receiving an error indication associated with the memory device; and
    responsive to receiving the error indication, setting the memory device as offline.

12. A machine-implemented method, comprising:
    responsive to a time interval having elapsed, providing a first check status command, wherein the time interval is associated with an operation for a memory device;
    receiving a first signal;
    determining whether the first signal indicates a status of the memory device;
    providing a second check status command after the first check status command;
    receiving a second signal;
    determining whether the second signal is different from the first signal; and
    responsive to the second signal being different from the first signal, providing an indication of a failure of the memory device.

13. The machine-implemented method of claim 12, further comprising:
    responsive to the second signal matching the first signal, determining whether an illogical status is detected;
    responsive to determining that the illogical status is detected, providing the indication of the failure of the memory device; and
    responsive to determining that the illogical status is not detected, providing an indication of a success of the memory device.

14. The machine-implemented method of claim 12, wherein the time interval represents a time for completing the operation for writing data on the memory device.

15. The machine-implemented method of claim 12, wherein:
the first signal comprises a first plurality of bits; and
one of the first plurality of bits indicates a ready status.

16. The machine-implemented method of claim 15, wherein:
another bit of the first plurality of bits indicates another status of the memory device; and
the another status is different from the ready status.

17. The machine-implemented method of claim 12, further comprising:
providing, in response to the indication of the failure of the memory device, a reset instruction for the memory device;
providing an initialization instruction for the memory device;
after providing the initialization instruction, receiving an error indication associated with the memory device; and
responsive to receiving the error indication, setting the memory device as offline.

18. An apparatus, comprising:
means for providing, responsive to a time interval having elapsed, a first check status command, wherein the time interval is associated with an operation for a memory device;
means for receiving a first signal;
means for determining whether the first signal indicates a status of the memory device;
means for providing a second check status command after the first check status command;
means for receiving a second signal;
means for determining whether the second signal is different from the first signal; and
means for providing, responsive to the second signal being different from the first signal, an indication of a failure of the memory device.

19. The apparatus of claim 18, further comprising:
means for determining, responsive to the second signal matching the first signal, whether an illogical status is detected;
means for providing, responsive to determining that the illogical status is detected, the indication of the failure of the memory device; and
means for providing, responsive to determining that the illogical status is not detected, an indication of a success of the memory device.

20. The apparatus of claim 18, wherein:
the time interval represents an average time for completing the operation; and
the operation is a program operation.

\* \* \* \* \*